(12) United States Patent
Wang et al.

(10) Patent No.: US 8,853,071 B2
(45) Date of Patent: Oct. 7, 2014

(54) ELECTRICAL CONNECTORS AND METHODS FOR FORMING THE SAME

(71) Applicant: Taiwan Semiconductor Manufacturing Company, Ltd., Hsin-Chu (TW)

(72) Inventors: Chun-Chieh Wang, Beigang Township (TW); Hung-Jui Kuo, Hsin-Chu (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/789,899

(22) Filed: Mar. 8, 2013

(65) Prior Publication Data

US 2014/0256126 A1    Sep. 11, 2014

(51) Int. Cl.
*H01L 21/70* (2006.01)
*H01L 23/00* (2006.01)

(52) U.S. Cl.
CPC ..................................... *H01L 24/11* (2013.01)
USPC .................... 438/612; 438/614; 257/E21.059

(58) Field of Classification Search
CPC ............ H01L 2224/10; H01L 2224/26; H01L 2224/4809; H01L 2924/00; H01L 2924/0014
USPC ............ 438/611–614; 257/E21.508, E21.509
See application file for complete search history.

(56) References Cited

U.S. PATENT DOCUMENTS

| 6,622,907 | B2 | 9/2003 | Fanti et al. |
| 8,241,963 | B2 | 8/2012 | Shen et al. |
| 2012/0049346 | A1 | 3/2012 | Lin et al. |
| 2012/0068334 | A1* | 3/2012 | Migita et al. .................. 257/737 |

* cited by examiner

*Primary Examiner* — Thanhha Pham
(74) *Attorney, Agent, or Firm* — Slater and Matsil, L.L.P.

(57) ABSTRACT

A method includes coating a photo resist over an Under-Bump Metallurgy (UBM) layer and exposing the photo resist. In the step of exposing, a light amount reaching a bottom of the photo resist is less than about 5 percent of a light amount reaching a top surface of the photo resist. The method further includes developing the photo resist to form an opening in the photo resist. A portion of the UBM layer is exposed through the opening. The opening has a bottom lateral dimension greater than a top lateral dimension. An electrical connector is formed in the opening, wherein the electrical connector is non-reflowable.

18 Claims, 9 Drawing Sheets

ELECTRICAL CONNECTORS AND METHODS FOR FORMING THE SAME

BACKGROUND

In the formation of a semiconductor wafer, integrated circuit devices such as transistors are first formed at the surface of a semiconductor substrate. Interconnect structures are then formed over the integrated circuit devices. Metal bumps are formed on the surface of the semiconductor chip, so that the integrated circuit devices can be accessed.

In a typical metal bump formation process, an Under-Bump Metallurgy (UBM) layer is first formed. Metal bumps are then formed on the UBM layer, for example, by plating. The formation process includes forming a mask to cover first portions of the UBM layer, and leave second portions of the UBM layer un-covered. The metal bumps are plated on the second portions of the UBM layer. After the formation of the metal bumps, the first portions of UBM layer are removed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A method for forming electrical connectors for circuits is provided in accordance with various embodiments. The intermediate stages of manufacturing the electrical connectors in accordance with the embodiments are illustrated. The variations of the embodiments are discussed. Throughout the various views and illustrative embodiments, like reference numbers are used to designate like elements. In the illustrated embodiments, a device wafer (or an interposer wafer or a package substrate) is shown as an example to explain the concepts of the embodiments of the present disclosure. It is appreciated that the concepts of the embodiments may apply to any other integrated circuit component in which electrical connectors, for example, for bonding purpose, are used.

Figure 1:
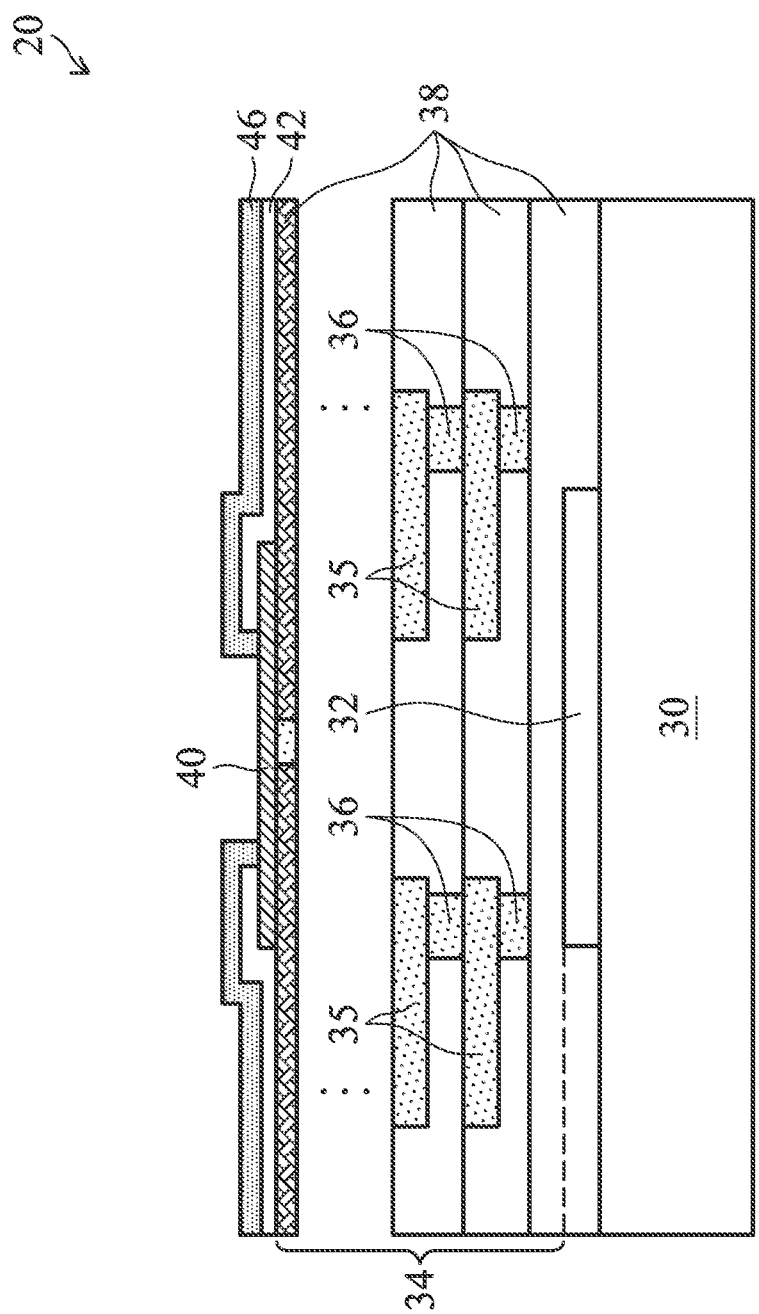
FIGS. 1 through 7 are cross-sectional views of intermediate stages in the manufacturing of an electrical connector in accordance with some embodiments.

Referring to FIG. 1, wafer 20, which includes substrate 30, is provided. In some embodiments, substrate 30 is a semiconductor substrate such as a silicon substrate, although it may be formed of other semiconductor materials, such as silicon germanium, silicon carbon, gallium arsenide, or the like. Semiconductor devices 32, which may include transistors, diodes, resistors, or the like, may be formed at the surface of substrate 30. Interconnect structure 34, which includes metal lines and vias (not shown) formed therein and electrically coupled to semiconductor devices 32, is formed over substrate 30. The metal lines and vias may be formed of copper or copper alloys, and may be formed using damascene processes. In alternative embodiments, feature 20 is an interposer wafer or a package substrate strip, and is substantially free from active devices (including transistors) and passive devices (such as resistors, capacitors, inductors, and/or the like). In these embodiments, substrate 30 may be formed of a semiconductor material or a dielectric material.

Interconnect structure 34 includes dielectric layers 38, and metal lines 35 and vias 36 formed in dielectric layers 38. Dielectric layers 38 may include an Inter-Layer Dielectric (ILD) and Inter-Metal Dielectrics (IMDs). In some embodiments, dielectric layers 38 are formed of low-k dielectric materials. The dielectric constants (k values) of the low-k dielectric materials may be less than about 2.8, or less than about 2.5, for example. Metal lines 35 and vias (or contact plugs) 36 may be formed of copper, copper alloys, tungsten, or other metal-containing conductive materials. Metal lines 35 and vias 36 may be formed using single damascene and/or dual damascene processes.

Metal pad 40 is formed over interconnect structure 34. Metal pad 40 may be an aluminum pad or an aluminum-copper pad. Metal pad 40 may be electrically connected to underlying devices 32 through metal lines 35 and vias/contact plugs 36 in interconnect structure 34.

Passivation layer 42 is formed to cover the edge portions of metal pad 40. The central portion of metal pad 40 is exposed through an opening in passivation layer 42. Passivation layer 42 may be formed of a non-porous material. In some embodiments, passivation layer 42 is a composite layer comprising a silicon oxide layer (not shown), and a silicon nitride layer (not shown) over the silicon oxide layer. In alternative embodiments, passivation layer 42 comprises Un-doped Silicate Glass (USG), silicon oxynitride, and/or the like. Although one passivation layer 42 is shown, there may be more than one passivation layer.

Polymer layer 46 is formed over passivation layer. Polymer layer 46 may comprise a polymer such as a polyimide, benzocyclobutene (BCB), polybenzoxazole (PBO), and the like. Polymer layer 46 is patterned to form an opening, through which a central portion of metal pad 40 is exposed.

Figure 2:
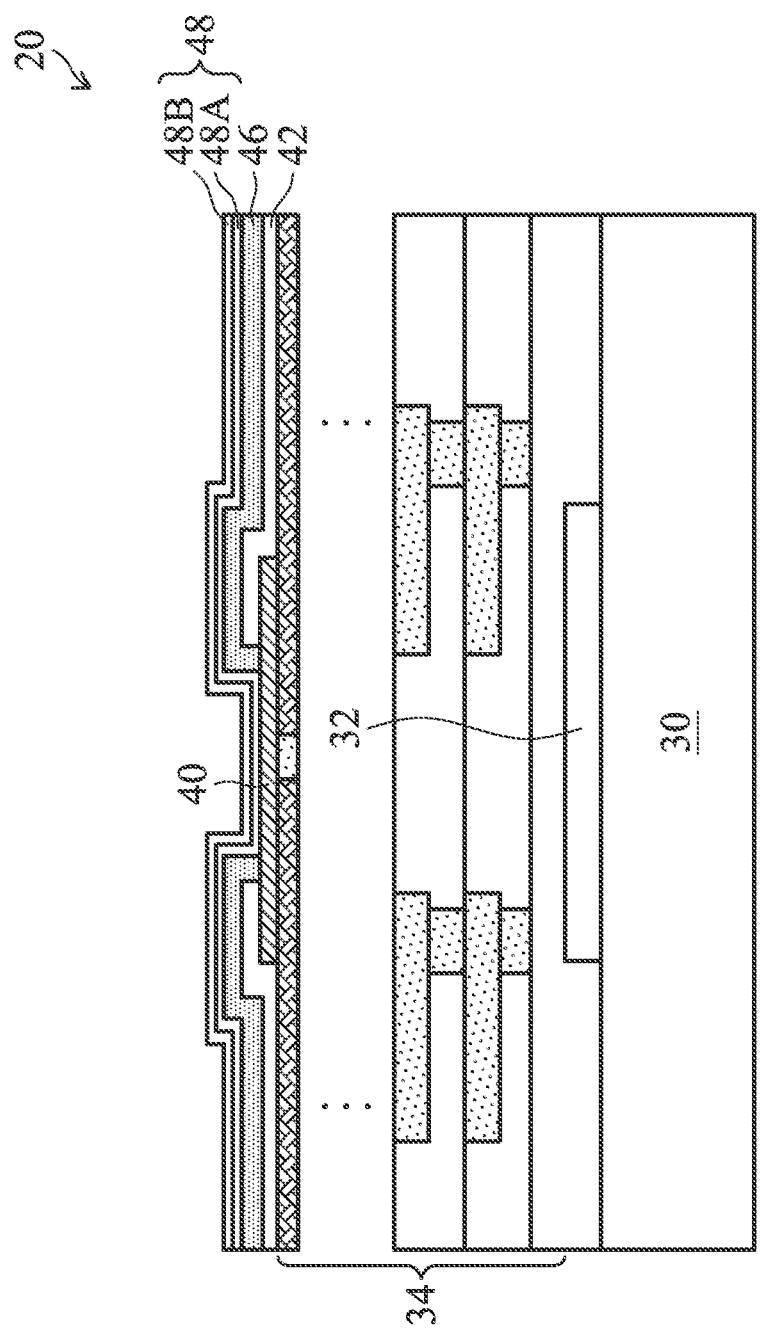

Referring to FIG. 2, Under-Bump Metallurgy (UBM) layer 48 is formed. In some embodiments, UBM layer 48 includes barrier layer 48A and seed layer 48B over barrier layer 48A. Barrier layer 48A extends into the opening in passivation layer 42, and is electrically coupled to, and may be in physical contact with, metal pad 40. Barrier layer 48A may be a titanium layer, a titanium nitride layer, a tantalum layer, a tantalum nitride layer, or layers formed of a titanium alloy or a tantalum alloy. The materials of seed layer 48B may include copper or copper alloys, and hence seed layer 48B is alternatively referred to as a copper seed layer hereinafter. However, other metals such as silver, gold, aluminum, palladium, nickel, nickel alloys, tungsten alloys, chromium, chromium alloys, and combinations thereof may also be included. In some embodiments, barrier layer 48A and seed layer 48B are formed using Physical Vapor Deposition (PVD) or other applicable methods. Barrier layer 48A may have a thickness between about 500 Å and about 2,000 Å. Seed layer 48B may have a thickness between about 1,000 Å and about 10,000 Å, although different thicknesses may be used.

Figure 3:
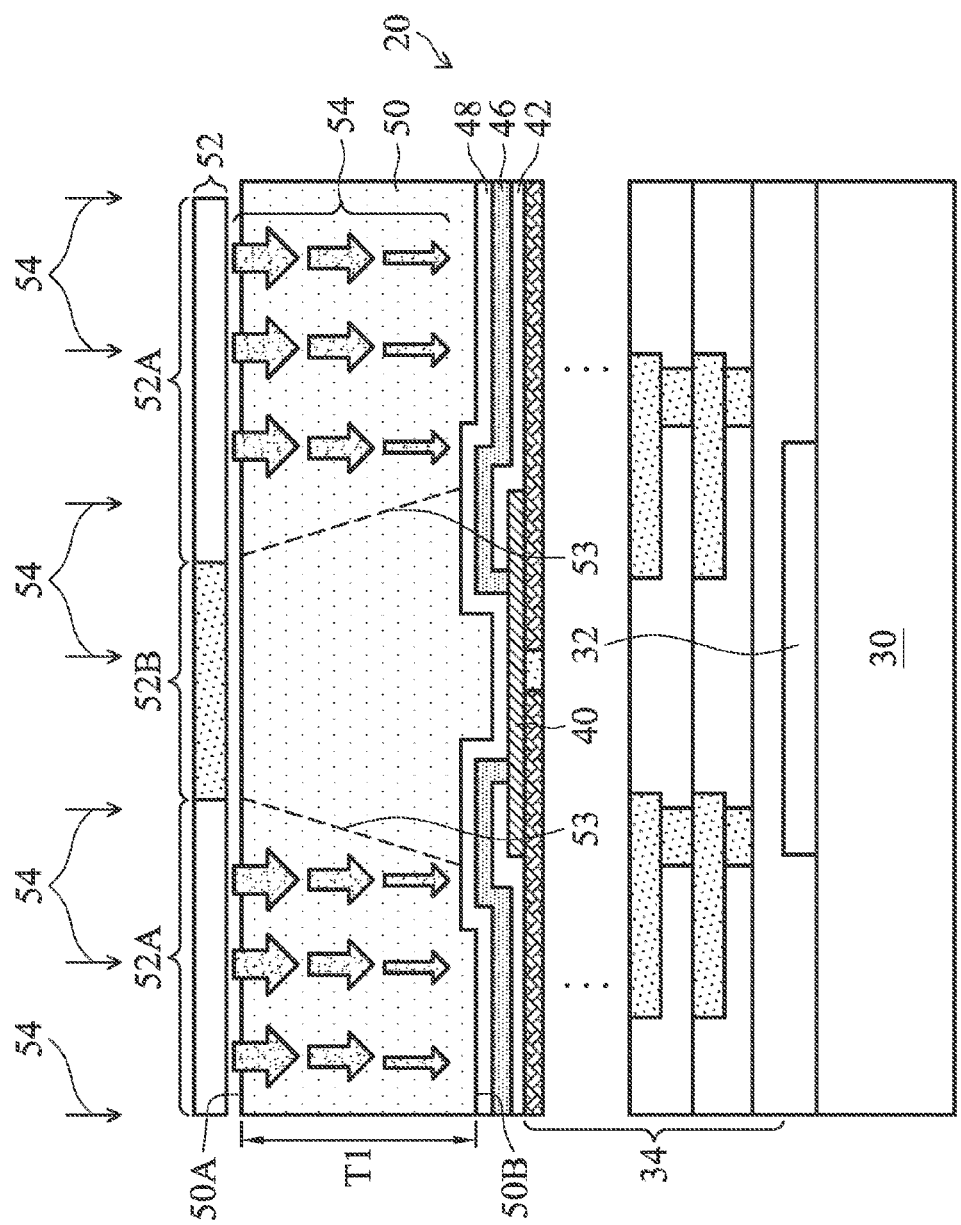

FIG. 3 illustrates the coating of photo resist 50, and the exposure of photo resist 50 using lithography mask 52. Lithography mask 52 includes transparent patterns 52A, which allows light 54 to penetrate through, and opaque portions 52B for blocking light 54. Photo resist 50 may have thickness T1, which is between about 30 μm and about 60 μm. It is appreciated, however, that the values recited throughout the description are merely examples, and may be changed to different values. Photo resist 50 may include a polymer, a solvent, a cross-linker, and a photo active compound (PAC). In some exemplary embodiments, the material of the polymer includes Acrylic resin, Novolak resin, or the like. The material of the solvent may include Propylene Glycol Monomethyl Ether Acetate (PGMEA) in some exemplary embodiments.

In some exemplary embodiments, the weight percentage of the polymer in photo resist 50 is lower than about 40 percent. The weight percentage of the solvent in photo resist 50 is lower than about 35 percent. The weight percentage of the cross-liner in photo resist 50 is lower than about 20 percent. The weight percentage of the PAC in photo resist 50 is lower than about 5 percent, and may be between about 1 percent and about 5 percent. The PAC may have a uniform distribution in photo resist 50, for example, with the PAC percentage in the top portion of photo resist 50 equal to the PAC percentage in the bottom portion of photo resist 50. In some embodiments, due to the selected PAC, the resulting photo resist 50 may have a transmittance lower than about 3.

As shown in FIG. 3, photo resist 50 is exposed using light 54. Lithography mask portion(s) 52B blocks light 54 from reaching the underlying portion(s) of photo resist 50. Lithography mask portion(s) 52A allows light 54 to pass through and reaches the underlying portion(s) of photo resist 50. Since photo resist 50 has a transmittance lower than the transmittance of typical PACs, the PAC in photo resist 50 absorbs light 54. The amount of light 54 hence reduces increasingly when light 54 travels down through photo resist 50. The amount of light 54 received by lower portions of photo resist 50 is thus less than the amount of light 54 received by upper portions of photo resist 50. Arrows 54 are drawn in photo resist 50 to indicate the reduction of light amount, wherein from the top to the bottom of photo resist 50, the widths of arrows 54 are increasingly smaller. The material of the PAC partially determines the wavelength of the light that the PAC is capable of absorbing, and determines the respective absorption rate. In accordance with some embodiments, the material of PAC is selected to match the wavelength of light 54, so that an appropriate absorption rate is achieved, and vice versa. If the light intensity of light 54 at the top surface 50A of photo resist 50 is LIGI1, and the light intensity of light 54 at the bottom surface 50B of photo resist 50 is LIGI2, then ratio LIGI2/LIGI1 is smaller than about 0.05 (which is 5 percent), and may be smaller about 0.02. Ratio LIGI2/LIGI1 may also be between about 0.005 (0.5 percent) and about 0.05 in some exemplary embodiments.

Figure 4:
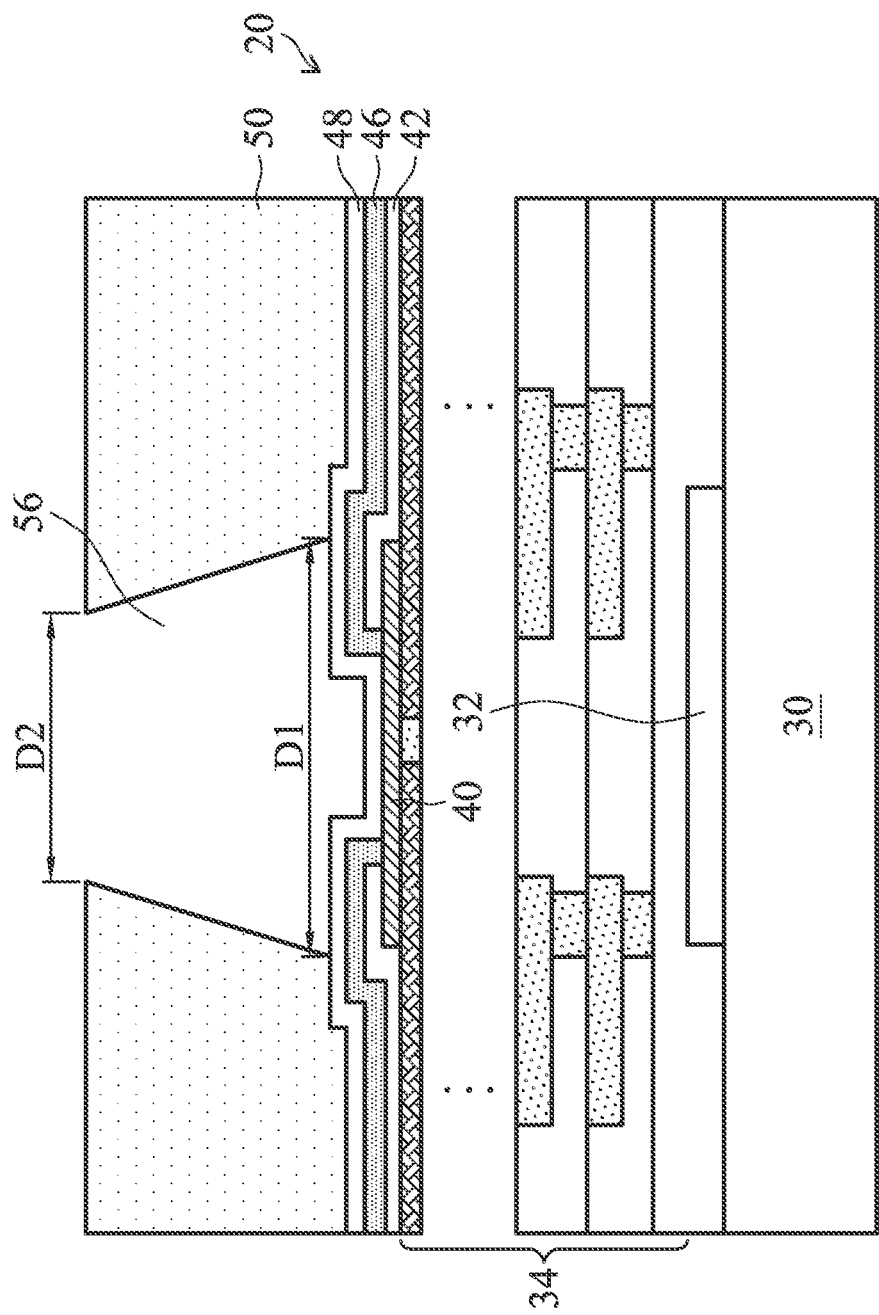

Referring to FIG. 4, after the light exposure, photo resist 50 is developed. Opening 56 is thus formed in photo resist 50, wherein a portion of UBM layer 48 is exposed through opening 56. A descum process is then performed to remove any residue of the removed portion of photo resist 50, which residue is in opening 56. The descum step may be performed, for example, using the plasma of oxygen ($O_2$). In some embodiments, photo resist 50 is a negative photo resist, and the unexposed portions (and the portions of photo resist 50 that do not receive adequate exposure) are removed, while exposed portions remain, wherein the unexposed portions are between dashed lines 53 in FIG. 3. Due to the increasing reduction of the light intensity when light 54 travels down through photo resist 50, dashed lines 53 in FIG. 3 are slanted.

Referring to FIG. 4 again, opening 56 has a tapered profile, and bottom lateral dimension D1 is greater than top lateral dimension D2. Bottom lateral dimension D1 and top lateral dimension D2 are measured in the same cross-sectional view, and may be lengths, widths, diameters, or the like, depending on the top-view shape of opening 56. In some embodiments, difference (D1−D2) is greater than about 4 μm, and may be between about 4 μm and about 20 μm. Difference (D1−D2), however, can be greater (for example, as high as about 54 μm or higher) or smaller (for example, between about 1 μm and about 4 μm. Experiments have indicated that difference (D1−D2) is related to the amount of PAC in photo resist 50. For example, increasing the amount of PAC in photo resist 50 may result in the increase in difference (D1−D2), and reducing the amount of PAC in photo resist 50 results in the reduction in difference (D1−D2). Reducing the amount of PAC in photo resist 50 means increasing the transmittance of photo resist 50, so that a greater amount of light 54 may reach the bottom of photo resist 50, and increasing the amount of PAC in photo resist 50 means reducing the transmittance of photo resist 50, so that a smaller amount of light 54 may reach the bottom of photo resist 50.

Furthermore, experiments also indicated that dimension difference (D1−D2) is related to the exposure amount of light 54. The exposure amount is affected by both the light intensity and the exposure time. Reducing the exposure amount may cause more bottom portion of photo resist 50 to be inadequately exposed, and hence results in the increase in difference (D1−D2). Conversely, increasing the exposure amount of light 54 results in the reduction in difference (D1−D2). For example, in an experiment, by reducing the exposure amount from 1,000 mJoule/$cm^2$ to 400 mJoule/$cm^2$, difference (D1−D2) is increased from about 17 μm to about 54 μm. When the exposure amount is high enough, bottom lateral dimension D1 may be substantially equal to top dimension D2. Accordingly, to achieve a tapered opening 56, the exposure amount is controlled.

Figure 5:
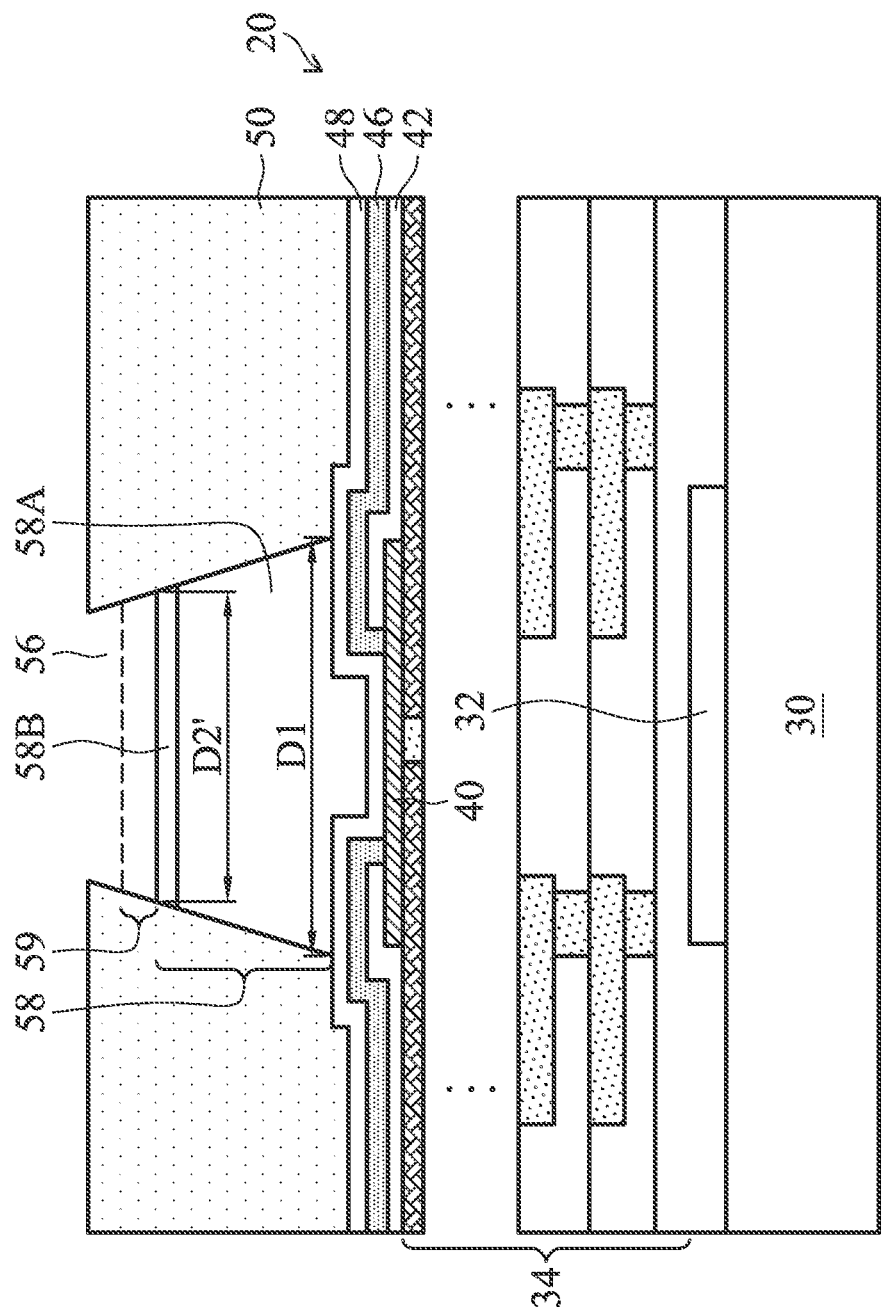

Next, as also shown in FIG. 5, electrical connector 58 is formed. Electrical connector 58 may be a metal bump, and hence is referred to as metal bump 58 hereinafter. Furthermore, metal bump 58 may be formed of a non-reflowable material that cannot be reflowed at the temperatures for reflowing solder, and hence metal bump 58 is also a non-solder bump. In some embodiment, a plating step is performed to form metal bump 58 on UBM layer 48 and in opening 56. The plating may be an electro-plating, an electroless-plating, an immersion plating, or the like. In some exemplary embodiments, metal bump 58 includes bump portion 58A, which cannot be reflowed due to their high melting temperature, and may be a copper pillar. Additional portions, which are illustrated as layer 58B, may be formed over bump portion 58A. In some embodiments, the additional portions 58B are selected from the group consisting of a nickel layer, a nickel alloy, a palladium layer, a gold layer, a silver layer, and combinations thereof. In some embodiments, solder layer 59 is plated over metal bump 58, and may comprise a Sn—Ag alloy, a Sn—Cu alloy, a Sn—Ag—Cu alloy, or the like, and may be lead-free or lead-containing. In alternative embodiments, solder layer 59 is not formed. The sidewalls of metal bump 58 has a same profile as the sidewalls of opening 56, and hence bottom dimension D1 of metal bump 58 is also greater than top dimension D2' of metal bump 58.

Figure 6:
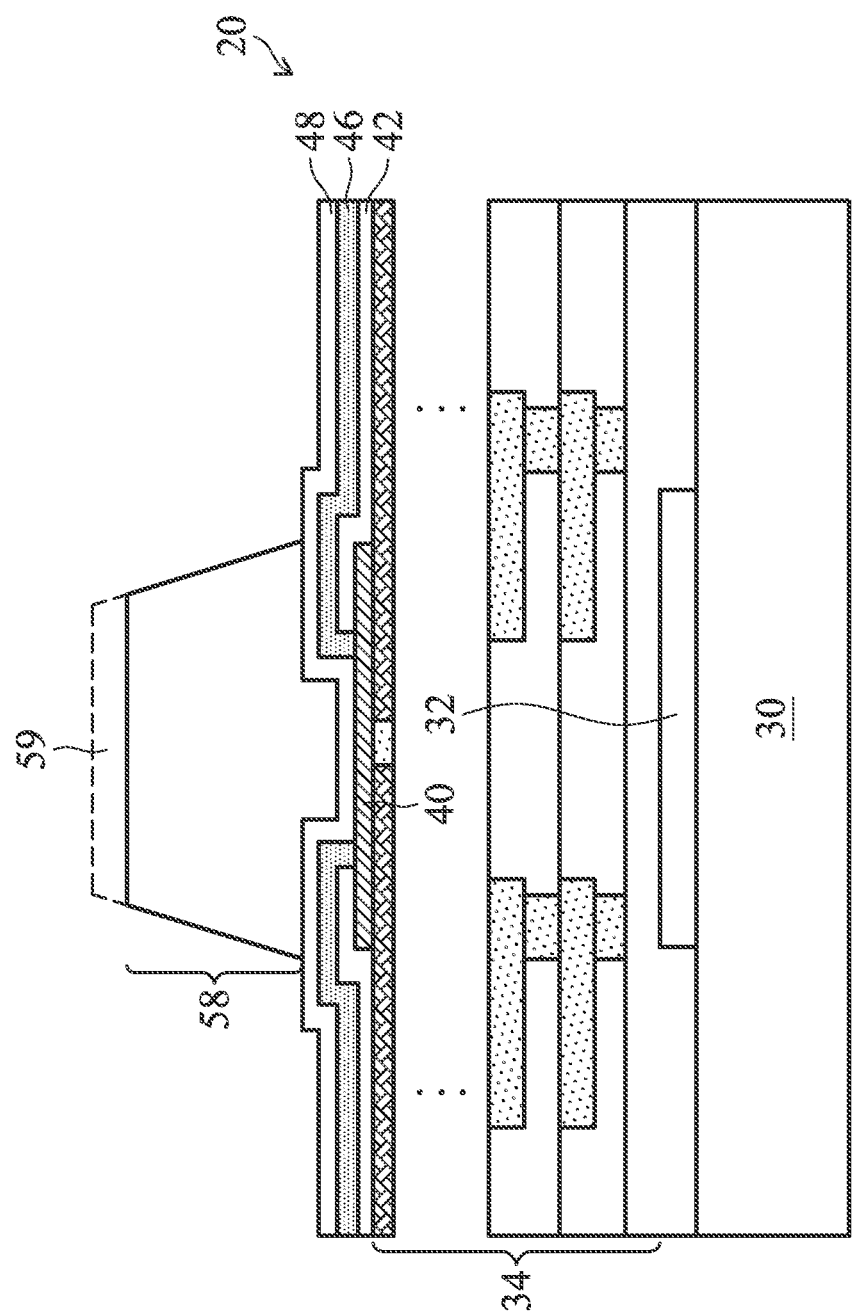
Figure 7:
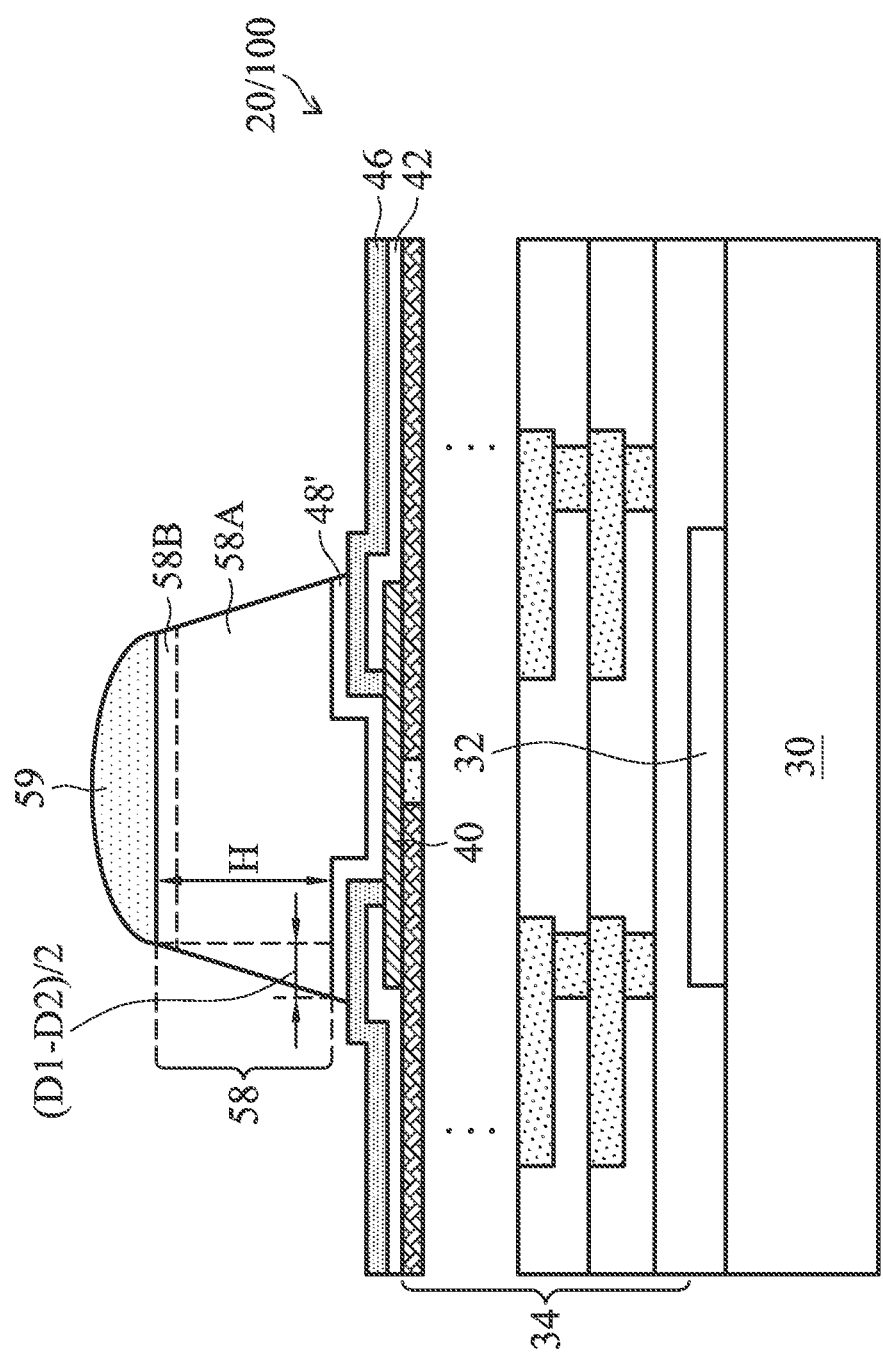

Next, photo resist 50 is removed, for example, in an ashing process. The resulting structure is shown in FIG. 6. Portions of UBM layer 48 are exposed as a result of the removal of photo resist 50. Next, as shown in FIG. 7, the exposed portions of UBM layer 48 are etched. A portion of UBM layer 48 overlapped by metal bump 58 remains, and is referred to as UBM 48' hereinafter. The etching of UBM layer 48 may be performed using wet etching steps, dry etching steps, and/or the like. In the embodiments wherein solder layer 9 is included, a reflow step may be performed to reflow solder layer 59. Next, wafer 20 may be sawed apart into dies, which are denoted as discrete dies 100. Metal bump 58 may be used to bond dies 100 to other package components (not shown), which may be interposers, package substrates, printed circuit boards, or the like.

As shown in FIG. 7, metal bump 58 may have height H. Ratio ((D1−D2)/2)/H (which is (D1−D2)/2H) reflects how slant the sidewalls of metal bump 58 are. In some embodiments, Ratio (D1−D2)/2H is greater than about 0.06, and may be between about 0.06 and about 0.3, and may further be between about 0.2 and 0.3.

Figure 8:
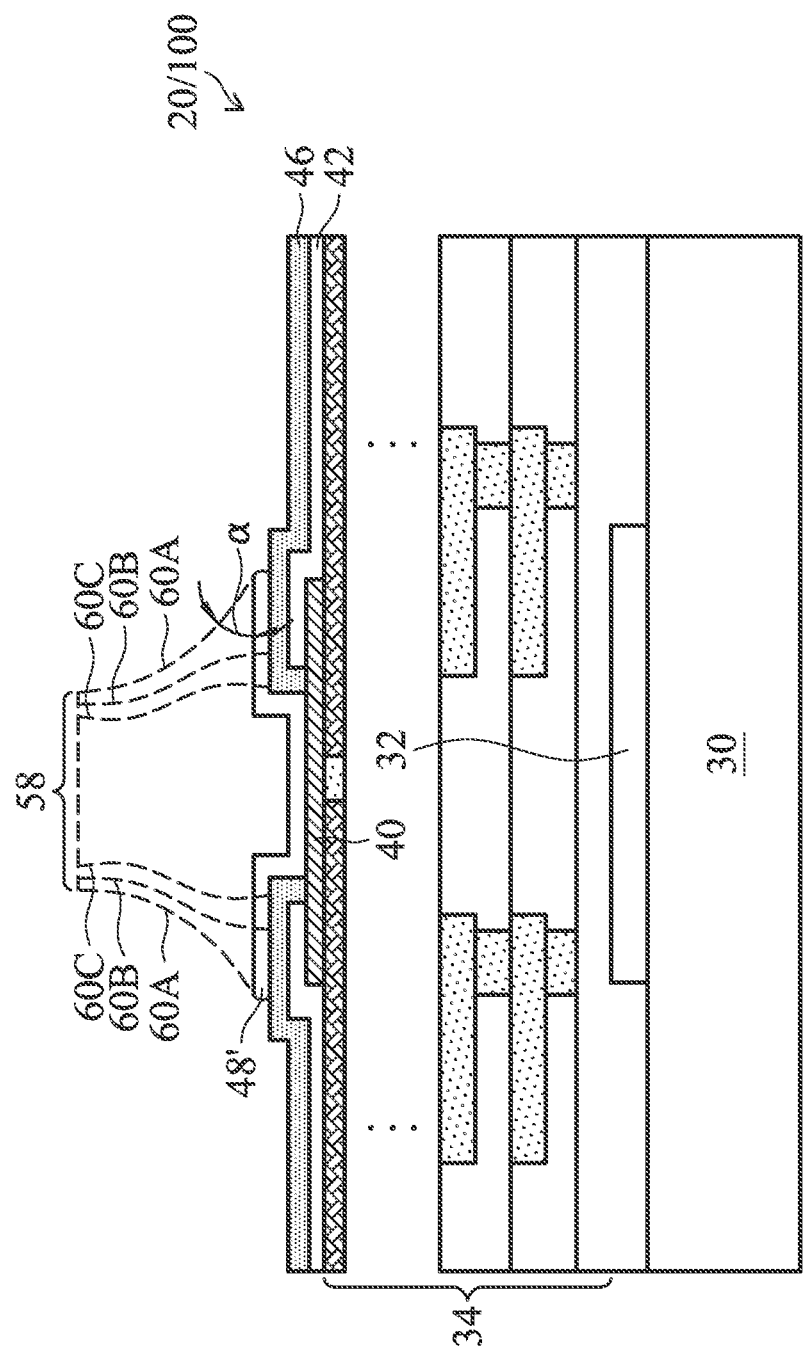
FIG. 8 illustrates electrical connectors in accordance with various embodiments, wherein the electrical connectors have different profiles.

FIG. 8 illustrates a plurality of likely profiles of metal bump 58, wherein lines 60A, 60B, and 60C are possible shapes and profiles of the sidewalls of metal bumps 58. For example, as shown by lines 60A, the cross-sectional view of metal bump 58 has a bell-shape, with the top portions less slant than bottom portions. At the bottom portion, the sidewalls of metal bump 58 may have portions with slant angles α smaller than about 60 degree, smaller than about 45 degrees, or smaller than about 30 degrees. Lines 60B and 60C are increasingly less slant than lines 60A. The profiles of metal bump 58 may be adjusted by selecting an appropriate PAC, adjusting the amount of the PAC, adjusting the wavelength of the light for exposure (FIG. 3), and adjusting the exposure amount. Lines 60A, 60B, and 60C are smoothly transitioned from top to bottom, with no abrupt transition between any portions in either one of lines 60A, 60B, and 60C.

Figure 9C:
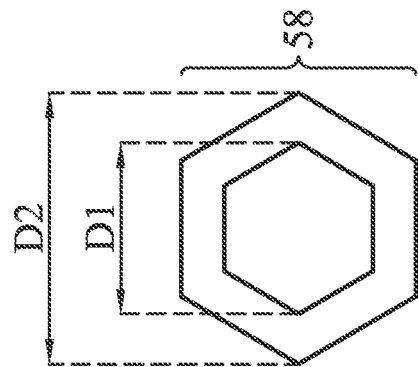
FIGS. 9A, 9B, and 9C illustrate top views of the electrical connectors in accordance with various embodiments, wherein the electrical connectors have different shapes.
Figure 9B:
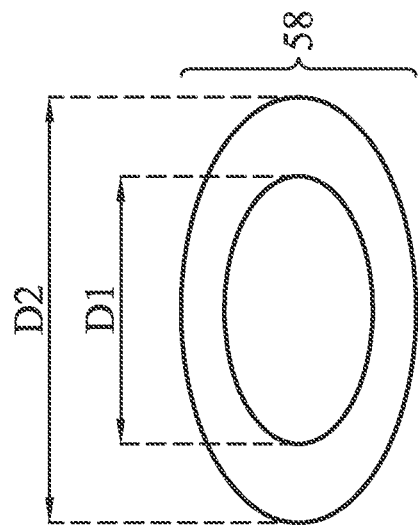
Figure 9A:
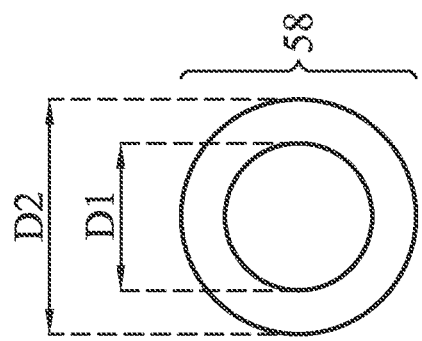

FIGS. 9A, 9B, and 9C illustrate the top views of metal bump 58 in accordance with various exemplary embodiments. Each of FIGS. 9A, 9B, and 9C shows an inner shape and an outer shape, wherein the inner shape is the top-view shape of the top surface of metal bump 58, and the outer shape is the top-view shape of the bottom surface of metal bump 58. In the top view, metal bump 58 may have a circular shape (FIG. 9A), an ellipse shape (FIG. 9B), a rectangular shape (not shown), a hexagon (FIG. 9C, or other polygon), or any other shape. Bottom dimension D1 and top dimension D2 are illustrated.

In accordance with exemplary embodiments of the present disclosure, by choosing appropriate PAC in a photo resist for forming metal bumps, the appropriate wavelength for exposing the photo resist, and/or the appropriate light amount for exposing the photo resist, the metal bumps may have bottom dimensions greater than the respective top dimensions. With greater bottom dimensions, the stress applied by the metal bumps to the underlying low-k dielectric layers is reduced, and low-k dielectric lamination may be reduced. With smaller top dimensions, the solder regions that are used for bonding, which solder regions are formed to connect to metal bumps 58, may have smaller sizes. Solder bridging is thus reduced.

In accordance with embodiments, a method includes method includes coating a photo resist over a UBM layer and exposing the photo resist. In the step of exposing, a light amount reaching a bottom of the photo resist is less than about 3 percent of a light amount reaching a top surface of the photo resist. The method further includes developing the photo resist to form an opening in the photo resist. A portion of the UBM layer is exposed through the opening. The opening has a bottom lateral dimension greater than a top lateral dimension. An electrical connector is formed in the opening, wherein the electrical connector is non-reflowable.

In accordance with other embodiments, a method includes coating a photo resist over a UBM layer, exposing the photo resist using a lithography mask, and developing the photo resist to remove an exposed portion of the photo resist to form an opening in the photo resist, wherein an unexposed portion of the photo resist remains after the step of developing. An electrical connector is plated in the opening, wherein the electrical connector has a bottom lateral dimension greater than a top lateral dimension. After the step of plating, the photo resist is removed. Portions of the UBM layer that are exposed after the step of removing the photo resist are also removed.

In accordance with yet other embodiments, a method includes coating a photo resist over a UBM layer, wherein the photo resist includes a PAC. The photo resist absorbs a light used for the exposing, wherein a first light intensity of the light at a bottom surface of the photo resist to a second light intensity of the light at a top surface of the photo resist is smaller than about 0.05. The photo resist is exposed in an exposure step using a lithography mask. The photo resist is developed to remove an exposed portion of the photo resist to form an opening in the photo resist. An electrical connector is plated in the opening. After the step of plating, the photo resist is removed. Portions of the UBM layer that are exposed after the step of removing the photo resist are removed.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
coating a photo resist over a Under-Bump Metallurgy (UBM) layer;
exposing the photo resist, wherein in the step of exposing, a light amount reaching a bottom of the photo resist is less than about 5 percent of a light amount reaching a top surface of the photo resist;
developing the photo resist to form an opening in the photo resist, wherein a portion of the UBM layer is exposed through the opening, and wherein the opening has a bottom lateral dimension greater than a top lateral dimension; and
forming an electrical connector in the opening, wherein the electrical connector is non-reflowable.

2. The method of claim 1, wherein the photo resist is a negative photo resist, and wherein in the step of developing the photo resist, unexposed portions of the photo resist are removed.

3. The method of claim 1, wherein in the step of exposing, a light amount reaching a bottom of the photo resist is between about 0.5 percent and about 5 percent of a light amount reaching a top surface of the photo resist.

4. The method of claim 1, wherein in the step of exposing, a light amount reaching a bottom of the photo resist is less than about 2 percent of a light amount reaching a top surface of the photo resist.

5. The method of claim 1 further comprising:
after the step of forming the electrical connector, removing the photo resist; and
removing portions of the UBM layer that are exposed after the step of removing the photo resist.

6. The method of claim 1, wherein a difference between the bottom lateral dimension and the top lateral dimension is greater than about 4 μm.

7. The method of claim 1, wherein the bottom dimension and the top dimension have a difference, wherein the metal bump has a height, and wherein a ratio of a half of the difference to the height is greater than about 0.06.

8. A method comprising:
coating a photo resist over a Under-Bump Metallurgy (UBM) layer;
exposing the photo resist using a lithography mask, wherein in the exposing, a light intensity reaching a bottom of the photo resist is less than about 5 percent of a light intensity at received by a top surface of the photo resist;
developing the photo resist to remove an unexposed portion of the photo resist to form an opening in the photo resist, wherein the photo resist comprises a Photo Active Compound (PAC), and wherein an exposed portion of the photo resist remains after the step of developing;
plating an electrical connector in the opening, wherein the electrical connector has a bottom lateral dimension greater than a top lateral dimension;
after the step of plating, removing the photo resist; and
removing portions of the UBM layer that are exposed after the step of removing the photo resist.

9. The method of claim 8, wherein a difference between the bottom lateral dimension and the top lateral dimension is greater than about 4 μm.

10. The method of claim 9, wherein the electrical connector has a height, and wherein a ratio of a half of the difference to the height is greater than about 0.06.

11. The method of claim 8, wherein the electrical connector comprises a non-solder material, wherein the method further comprises sawing a wafer comprising the electrical connector into discrete dies, and wherein after the step of sawing, the electrical connector remains to have the bottom lateral dimension greater than the top lateral dimension.

12. The method of claim 11, wherein the PAC has a weight percentage lower than about 1 percent.

13. The method of claim 8, wherein the electrical connector comprises a solder layer, and wherein the method further comprises reflowing the solder layer.

14. A method comprising:
coating a photo resist over a Under-Bump Metallurgy (UBM) layer, wherein the photo resist comprises a Photo Active Compound (PAC);
exposing the photo resist using a lithography mask, wherein the photo resist absorbs a light used for the exposing, and wherein a first light intensity of the light at a bottom surface of the photo resist to a second light intensity of the light at a top surface of the photo resist is smaller than about 0.05;
developing the photo resist to remove an unexposed portion of the photo resist to form an opening in the photo resist;
plating an electrical connector in the opening, wherein the electrical connector comprises a non-solder material;
after the step of plating, removing the photo resist; and
removing portions of the UBM layer that are exposed after the step of removing the photo resist.

15. The method of claim 14, wherein the opening has a top lateral dimension, and a bottom lateral dimension greater than the top lateral dimension by a difference greater than about 4 μm.

16. The method of claim 14, wherein the photo resist has a thickness between about 30 μm and about 60 μm.

17. The method of claim 14, wherein the electrical connector has a cross-sectional view of a bell shape, with a bottom portion of the metal bump slanting more than a top portion of the metal bump.

18. The method of claim 14, wherein the photo resist comprises a polymer having a weight percentage less than about 40 percent, a solvent having a weight percentage less than about 35 percent, a cross-linker having a weight percentage less than about 20 percent, and the PAC having a weight percent less than about 5 percent.

* * * * *